(12) United States Patent
Hochwald et al.

(10) Patent No.: US 11,940,477 B2
(45) Date of Patent: Mar. 26, 2024

(54) METHODS AND APPARATUS FOR DETERMINING ELECTROMAGNETIC EXPOSURE COMPLIANCE OF MULTI-ANTENNA DEVICES

(71) Applicant: University of Notre Dame du Lac, South Bend, IN (US)

(72) Inventors: Bertrand Hochwald, South Bend, IN (US); Arash Ebadi Shahrivar, South Bend, IN (US)

(73) Assignee: University of Notre Dame du Lac, South Bend, IN (US)

( * ) Notice: Subject to any disclaimer, the term of this patent is extended or adjusted under 35 U.S.C. 154(b) by 903 days.

(21) Appl. No.: 16/961,044

(22) PCT Filed: Jan. 11, 2019

(86) PCT No.: PCT/US2019/013238
§ 371 (c)(1),
(2) Date: Jul. 9, 2020

(87) PCT Pub. No.: WO2019/140225
PCT Pub. Date: Jul. 18, 2019

(65) Prior Publication Data
US 2020/0371146 A1 Nov. 26, 2020

Related U.S. Application Data

(60) Provisional application No. 62/616,594, filed on Jan. 12, 2018.

(51) Int. Cl.
*G01R 29/08* (2006.01)
*H04B 1/3827* (2015.01)

(52) U.S. Cl.
CPC ..... *G01R 29/0878* (2013.01); *G01R 29/0835* (2013.01); *G01R 29/0857* (2013.01); *G01R 29/0892* (2013.01); *H04B 1/3838* (2013.01)

(58) Field of Classification Search
CPC .......... H01Q 1/24; H01Q 1/243; G01R 29/08; G01R 29/0835; G01R 29/0857;
(Continued)

(56) References Cited

U.S. PATENT DOCUMENTS 4,255,750 A * 3/1981 Riley ................. G01R 29/0878
343/703
6,525,657 B1 2/2003 Wojcik
(Continued)

OTHER PUBLICATIONS cSAR3d manufacturer's website—https://speag.swiss/products/csar3d/csar3d-overview.
(Continued)

*Primary Examiner* — Tho G Phan
(74) *Attorney, Agent, or Firm* — Greenberg Traurig, LLP (57) ABSTRACT

A method of determining electromagnetic exposure values for radiative compliance tests a transmitting device with multiple transmitters or antenna. The device transmits a first set of excitation signals that are chosen in advance. These signals are measured for their electromagnetic exposure values. A second set of excitation signals are then transmitted that are adaptively chosen based on result of a previous measurements of the first excitation signals. The second set of signals are also measured. From the measurements of the predetermined and adaptive signals, the electromagnetic exposure values of all possible transmitted signals are inferred.

20 Claims, 8 Drawing Sheets

(58) Field of Classification Search
CPC . G01R 29/0878; G01R 29/0892; G01S 13/02; H04B 1/3827; H04B 1/3838; H04B 7/155; H04B 17/11; H04B 17/21; H04W 52/28
See application file for complete search history.

(56) References Cited

U.S. PATENT DOCUMENTS

| | | | |
|---|---|---|---|
| 7,268,564 B2 | 9/2007 | Ozaki et al. | |
| 7,583,089 B2 | 9/2009 | Onishi et al. | |
| 7,688,246 B2* | 3/2010 | Hirata | G01R 29/0878 342/165 |
| 8,929,828 B2* | 1/2015 | Hochwald | H04B 7/0617 455/67.11 |
| 9,330,555 B2* | 5/2016 | Tesanovic | G08B 21/182 |
| 10,085,162 B2 | 9/2018 | Foegelle | |
| 10,447,413 B1* | 10/2019 | Nadakuduti | H04B 17/18 |
| 2009/0198502 A1 | 8/2009 | Williams | |
| 2011/0309904 A1 | 12/2011 | Hyde et al. | |
| 2012/0184215 A1 | 7/2012 | Malinen | |
| 2012/0270519 A1 | 10/2012 | Ngai et al. | |
| 2017/0322247 A1* | 11/2017 | Lu | G01R 29/0857 |
| 2017/0338550 A1 | 11/2017 | Alon et al. | |

OTHER PUBLICATIONS

International Search Report and Written Opinion for PCT/US2019/1013238, dated Apr. 12, 2019, 10 pages.
Dongarra et al., LINPACK users' guide. SIAM, 1979, 20 pp.
"Code of federal regulations," Federal Communications Commission, Telecommunications 47CFR2.1093, 2011.(2010), 2 pp.
"Keysight N5182A MXG Vector Signal Generator." [Online]. Available: http://www.keysight.com/en/pd-797248-pn-N5182A/mxg-rfvector-signal-generator?cc=US&lc=eng, retrieved Oct. 17, 2023, 2 pp.
Ahlbom et al., "Guidelines for limiting exposure to time-varying electric, magnetic, and electromagnetic fields (up to 300 GHz)," Health physics, vol. 74, No. 4, pp. 494-521, 1998.
Alon et al., "Prospects for millimeter-wave compliance measurement technologies [measurements corner]," IEEE Antennas and Propagation Magazine, vol. 59, No. 2, pp. 115-125, Apr. 2017.
Andrews et al., "What will 5G be?" IEEE Journal on Selected Areas in Communications, vol. 32, No. 6, pp. 1065-1082, Jun. 2014.
Barnes et al., "Biological and Medical Aspects of Electromagnetic Fields," Handbook of Biological Effects of Electromagnetic Fields, 3rd ed. CRC Press, 2007, 47 pp.
Bolomey, "Overview of fast SAR assessment techniques," in Antenna Technology: Small Antennas and Novel Metamaterials, 2008. iWAT 2008. International Workshop on, Mar. 2008, pp. 47-50.
Brishoual et al., "Methodology to interpolate and extrapolate SAR measurements in a volume in dosimetric experiment," IEEE Transactions on Electromagnetic Compatibility, vol. 43, No. 3, pp. 382-389, Aug. 2001.
Castellanos et al., "Hybrid precoding for millimeter wave systems with a constraint on user electromagnetic radiation exposure," in 2016 50th Asilomar Conference on Signals, Systems and Computers, Nov. 2016, pp. 296-300.
Colombi et al., "Implications of EMF exposure limits on output power levels for 5G devices above 6 GHz," IEEE Antennas and Wireless Propagation Letters, vol. 14, pp. 1247-1249, 2015.
Douglas et al, "Accurate and fast estimation of volumetric SAR from planar scans from 30 MHz to 6 GHz," in Bioelectromagnetics Society 29th Annual Meeting, Jun. 2007. http://www.proceedings.com/01634.html (Uploading Table of Contents only), 16 pp.
Douglas et al., "Comprehensive validation and uncertainty evaluation of new SAR measurement technologies," in 2016 10th European Conference on Antennas and Propagation (EuCAP), Apr. 2016, pp. 1-4.
Douglas et al., "Past, present, and future of SAR evaluations," in 2016 URSI Asia-Pacific Radio Science Conference (URSI AP-RASC), Aug. 2016, pp. 426-428.
Ebadi-Shahrivar, "Mixed Quadratic Model for Peak Spatial-average SAR of Coherent Multiple Antenna Devices," in 2017 IEEE International Symposium on Antennas and Propagation USNC/URSI National Radio Science Meeting, Jul. 2017, 2 pp.
Evaluating compliance with FCC guidelines for human exposure to radiofrequency electromagnetic fields, Federal Communications Commission, Tech. Rep. OET Bull 65, Suppl. C, ed. 01-01, Jun. 2001, 57 pp.
Finkelstein, "Pure-state informationally complete and really complete measurements," Physical Review A, vol. 70, No. 5, p. 052107, Nov. 2004.
Hochwald et al., "Incorporating specific absorption rate constraints into wireless signal design," IEEE Communications Magazine, vol. 52, No. 9, pp. 126-133, Sep. 2014.
Hochwald et al., "SAR codes," in Information Theory and Applications Workshop (ITA), 2013, Feb. 2013, pp. 1-9.
IEC/TR 62630, "Guidance for evaluating exposure from multiple electromagnetic sources," IEC, Tech. Rep., 2010 (Uploading table of contents only), 7 pp.
IEEE Recommended Practice for Determining the Peak Spatial-Average Specific Absorption Rate (SAR) in the Human Head From Wireless Communications Devices: Measurement Techniques, IEEE Std. 1528-2013 (Revision of IEEE Std 1528-2003), Sep. 2013, 246 pp.
IEEE Standard for Safety Levels with Respect to Human Exposure to Radio Frequency Electromagnetic Fields, 3kHz to 300GHz, IEEE Std. C95.1-2005, 250 pp.
Kanezaki et al., "Theoretical analysis for temperature elevation of human body due to millimeter wave exposure," in 2008 Cairo International Biomedical Engineering Conference, Dec. 2008, pp. 1-4.
Karmokar et al., "Analysis of inverted-F and loaded inverted-F antennas for 2.4 GHz ISM band applications," Journal of Electrical Engineering, vol. 36, No. 2, pp. 4-9, Dec. 2009.
Keysight Technologies, "Keysight E8267D PSG Vector Signal Generator." [Online]. Available: http://www.keysight.com/en/pdx-x202238-pn-E8267D/psg-vector-signal-generator-100-khz-to-44-ghz?cc=US&lc=eng, retrieved Oct. 17, 2023, 3 pp.
Le et al., "A method in determination of the specific absorption rate of multi-antenna devices," in Antennas and Propagation Society International Symposium (APSURSI), 2014 IEEE, Jul. 2014, pp. 1196-1197.
Le et al., "Measurement procedure to determine SAR of multiple antenna transmitters using scalar electric field probes," in 2014 International Conference on Advanced Technologies for Communications, Oct. 2014, pp. 54-59.
Li et al., "Efficient evaluation of specific absorption rate for MIMO terminals," Electronics Letters, vol. 50, No. 22, pp. 1561-1562, Oct. 2014.
Nicholas, "Analysis of the cholesky decomposition of a semidefinite matrix," in Reliable Numerical Computation. Oxford University Press, 1990, pp. 161-185.
Park et al., "Evolution of uplink MIMO for LTE-advanced," IEEE Communications Magazine, vol. 49, No. 2, pp. 112-121, Feb. 2011.
Perentos et al., "Exposure compliance methodologies for multiple input multiple output (MIMO) enabled networks and terminals," IEEE Transactions on Antennas and Propagation, vol. 60, No. 2, pp. 644-653, Feb. 2012.
Rappaport et al., "Millimeter wave mobile communications for 5G cellular: It will work!" IEEE Access, vol. 1, pp. 335-349, May 2013.
Renka, "Multivariate interpolation of large sets of scattered data," ACM Transactions on Mathematical Software (TOMS), vol. 14, No. 2, pp. 139-148, 1988.
RF exposure procedures and equipment authorization policies for mobile and portable devices, Federal Communications Commission, Tech. Rep. KDB447498, Oct. 2015, 34 pp.
Rowell et al., "Mobile-Phone Antenna Design," IEEE Antennas and Propagation Magazine, vol. 54, No. 4, pp. 14-34, Aug. 2012.
Schmid & Partner Engineering AG, "cSAR3D." [Online]. Available: https://www.speag.com/products/csar3d, 4 pp., retrieved Oct. 9, 2023.

(56) References Cited

OTHER PUBLICATIONS

Schmid & Partner Engineering AG, "SEMCAD-X." [Online]. Available: http://www.speag.com/products/semcad/, retrieved Oct. 17, 2023, 2 pp.

Soras et al., "Analysis and design of an inverted-F antenna printed on a PCMCIA card for the 2.4 GHz ISM band," IEEE Antennas and Propagation Magazine, vol. 44, No. 1, pp. 37-44, Feb. 2002.

Xu et al., "Power density measurements at 15 GHz for RF EMF compliance assessments of 5G user equipment," IEEE Transactions on Antennas and Propagation, vol. PP, No. 99, pp. 1-1, Jun. 2017.

Ying et al., "Closed-loop precoding and capacity analysis for multiple-antenna wireless systems with user radiation exposure constraints," IEEE Transactions on Wireless Communications, vol. 14, No. 10, pp. 5859-5870, Oct. 2015.

Zhadobov et al., "Millimeter-wave interactions with the human body: State of knowledge and recent advances," International Journal of Microwave and Wireless Technologies, vol. 3, No. 02, pp. 237-247, Apr. 2011.

\* cited by examiner

Algorithm 1: Function $\hat{R}_d = \text{LocalSAR}(d)$ $F = 0_{N\times 3}, k = 0, \mathbb{L} = \emptyset$;

for $i = 1, \ldots N$ do

$\quad c_i = \widetilde{SAR}_L(d, e_i e_i^T)$;

end

$q = c$;

while $(k < 3 \ \& \ q \neq 0_{N\times 1})$ do

$\quad k = k + 1$;

$\quad \ell_k = \arg\max_{1 \leq i \leq N} q_i, \mathbb{L} = \mathbb{L} \cup \{\ell_k\}$;

$\quad f_{\ell_k k} = q_{\ell_k}$;

$\quad$ for $i = 1, \ldots, N \ \& \ i \notin \mathbb{L}$ do

$\quad\quad x_1 = e_{\ell_k} + e_i$;

$\quad\quad x_2 = e_{\ell_k} - j e_i$;

$\quad\quad f_{ik} = \frac{\widetilde{SAR}_L(d, x_1 x_1^H) - c_{\ell_k} - c_i}{2} - j \frac{\widetilde{SAR}_L(d, x_2 x_2^H) - c_{\ell_k} - c_i}{2} - \sum_{m=1}^{k-1} f_{im} f_{\ell_k m}^*$;

$\quad$ end

$\quad f_k = \frac{f_k}{\sqrt{f_{\ell_k k}}}$;

$\quad q = q - diag(f_k f_k^H)$;

end

$\hat{R}_d = FF^H = \sum_{k=1}^{3} (f_k f_k^H)$;

Note: $I_{N\times N} = [e_1 \ \ldots \ e_N], F = [f_1 \ f_2 \ f_3]$

FIG. 2B

Algorithm 2: Function $\hat{R}_d = \text{LocalSAR}(d)$ $F = 0_{N\times 3}, k = 0, \mathbb{L} = \emptyset;$ for $i = 1, \ldots N$ do
$\quad | \quad c_i = \widetilde{SAR}_L(d, e_i e_i^T);$
end

$c_0 = \widetilde{SAR}_L(d, I);$ $\mathbf{q} = \mathbf{c};$ while ($k < 3$ & $q \neq 0_{N\times 1}$) do
$\quad k = k + 1;$
$\quad \ell_k = \arg\max_{1 \leq i \leq N} q_i, \mathbb{L} = \mathbb{L} \cup \{\ell_k\};$
$\quad f_{\ell_k k} = q_{\ell_k};$
$\quad$ for $i = 1, \ldots, N$ & $i \notin \mathbb{L}$ do
$\quad\quad R_{x1} = I + 1_{\ell_k, i} + 1_{i, \ell_k};$
$\quad\quad R_{x2} = I + j1_{\ell_k, i} - j1_{i, \ell_k};$
$\quad\quad f_{ik} = \frac{\widetilde{SAR}_L(d, R_{x1}) - c_0}{2} - j\frac{\widetilde{SAR}_L(d, R_{x2}) - c_0}{2} - \sum_{m=1}^{k-1} f_{im} f_{\ell_k m}^*;$
$\quad$ end
$\quad f_k = \frac{f_k}{\sqrt{f_{\ell_k k}}};$
$\quad q = q - \text{diag}(\mathbf{f}_k \mathbf{f}_k^H);$
end

$\hat{R}_d = FF^H = \sum_{k=1}^{3} (\mathbf{f}_k \mathbf{f}_k^H);$

Note: $I_{N\times N} = [e_1 \ \ldots \ e_N], F = [\mathbf{f}_1 \ \mathbf{f}_2 \ \mathbf{f}_3]$

METHODS AND APPARATUS FOR DETERMINING ELECTROMAGNETIC EXPOSURE COMPLIANCE OF MULTI-ANTENNA DEVICES

CROSS REFERENCE TO RELATED PATENT APPLICATIONS

This application is a 371 National Stage application of International PCT Application No. PCT/US2019/013238, filed Jan. 11, 2019, which claims the benefit of U.S. Provisional Patent Application No. 62/616,594, filed Jan. 12, 2018, entitled "Antenna", the entire contents of each of which are hereby incorporated by reference in their entirety.

GOVERNMENT LICENSE RIGHTS

This invention was made with government support under CCF-1403458 awarded by the National Science Foundation. The government has certain rights in the invention.

FIELD OF THE DISCLOSURE

The present description relates generally to electromagnetic safety compliance via measurement of electromagnetic exposure metrics.

BACKGROUND OF RELATED ART

Beamforming and other multiple-antenna technologies that help close the link between the user equipment and an access point will become increasing popular to enable high uplink bandwidths. Portable devices with multiple transmitters operating at the same carrier frequency will mean the conventional procedures for electromagnetic safety compliance will be revisited as current testing methods are inadequate.

Commonly, wireless devices that are sold commercially and intended to be used or worn near the human body are subject to electromagnetic exposure compliance. Human exposure to non-ionizing electromagnetic radiation from portable wireless devices is usually measured by "maximum permissible exposure" (MPE) or "specific absorption rate" (SAR). SAR is the representation of power dissipated per unit mass and is a commonly accepted safety metric for portable wireless devices operating below 6 GHz and within 20 cm of the user's body. The measurement of SAR is commonly spatially-averaged over a cube containing 1 gram (1 g) or 10 grams (10 g) of the tissue mass are seen in SAR standards IEEE-1528 and IEC-62209. Moreover, these and other standards require SAR measurement of the device with a variety of common operating positions, called "gestures". For compliance, the worst-case measurement over all possible transmitted signals must be below a threshold.

As such, tests require that the device be tested in worst-case operating conditions, over all possible transmitted signals. Exposure monitoring in portable wireless devices has historically focused on establishing compliance for single-antenna devices, since mobile devices usually transmit with a single antenna for a given carrier frequency. When there are multiple transmitting antennas operating on a single carrier frequency, this can mean taking absorbed electromagnetic power measurements over all combinations of transmitted signals. The time required for this can be onerous when using a transmitter codebook or beamforming, for example, because each possible codeword or beam would then need to be tested separately, especially if the averaging duration of the SAR measurement is less than the average duration that each beam could be held constant.

Determining electromagnetic exposure compliance requires finding the transmitted excitation signal that gives the worst-case absorbed electromagnetic power, averaged over the duration of measurement, and comparing this measurement to a threshold. The process of determining compliance generally takes longer as transmitting antennas are added because the number of different possible transmitted signals generally grows and hence there are more signals to test. As an example, consider a beamforming system where the quantized phase resolution of any antenna is $\Delta\theta$ and N is the number of antennas; there are then $$\left(\frac{360}{\Delta\theta}\right)^{N-1}$$

phase differences possible, which is exponential based on the number of antennas. If each of these phase combinations is allowed as a fixed transmitted beam, then the SAR of each should be evaluated against the limit. Thus, the time needed to measure SAR for all these phase combinations is exponential based on N. Compliance verification techniques that can be done quickly are needed.

DETAILED DESCRIPTION

The following description of example methods and apparatus is not intended to limit the scope of the description to the precise form or forms detailed herein. Instead the following description is intended to be illustrative so that others may follow its teachings.

Figure 1:
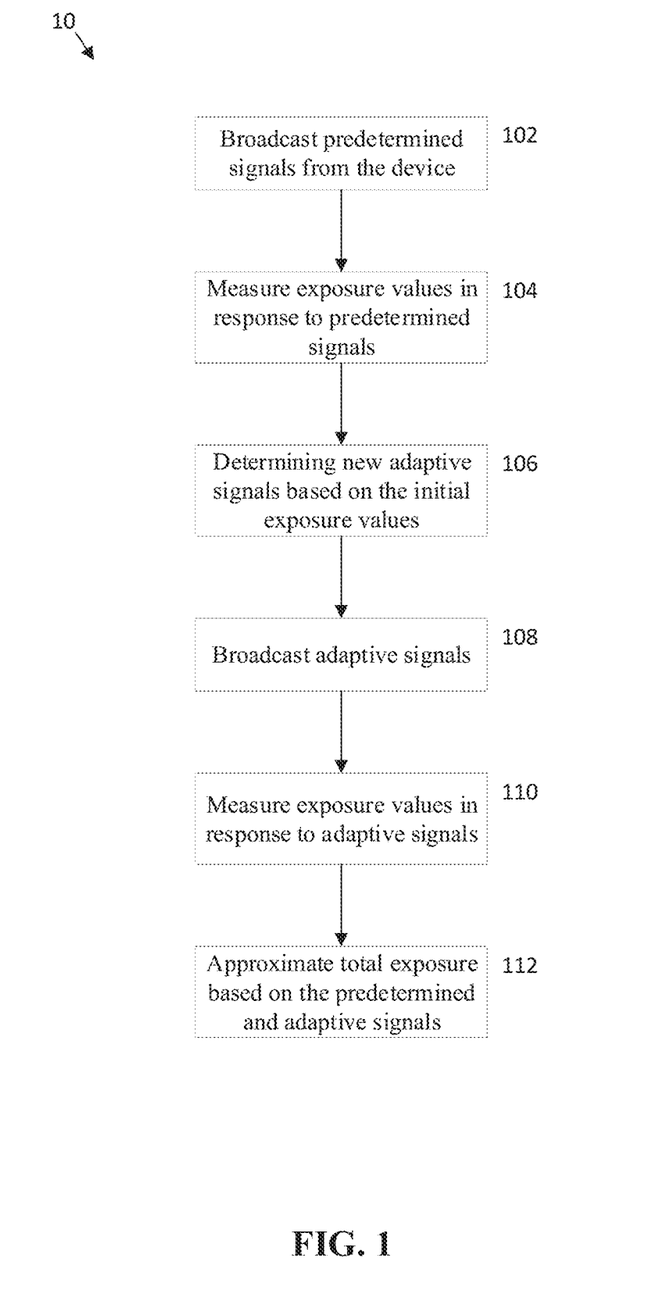
FIG. 1 is a flow chart of a first method of determining compliance of electromagnetic exposure standards according to the teachings of the present disclosure.

The device of this disclosure provides rapid electromagnetic exposure metrics such as specific absorption rate to assess user safety of portable wireless devices under all transmitting conditions and provides testing to cover all possible combinations of transmissions from all antennas. To better understand the following discussion a flowchart 10 is shown in FIG. 1. The flow chart 10 shows a first method of determining compliance of electromagnetic exposure standards according to the teachings of the present disclosure.

At step 102, the tested device is made by the evaluation system to broadcast predetermined signals from the device. At block 104, the evaluation system measures the electromagnetic exposure values in response to predetermined signals sent by the device. Using the results of the initial exposure values, the system determines new signals adaptively at block 106. These adaptive signals are chosen to develop a fast but complete model of the total radiative exposure pattern. The tested devices produce these signals at block 108 and the exposure values are measured at block 110. Using the measured exposure values from both the adaptive and the predetermined signals, the total exposure is approximated at block 112.

To begin from a definition of Specific Absorption Rate (SAR), SAR is the RF power absorption per unit mass of typically organic tissue, with units W/kg or equivalently mW/g SAR depends on the strength of the electric field and tissue properties, and is defined as $$SAR = \frac{P_{diss}(E(t,d), d, \sigma, \rho, T, V)}{m} = \qquad (1)$$

$$\frac{1}{V(d)} \int_{V(d)} \frac{\sigma(d')(E^H(t,d')E(t,d'))_T}{2\rho(d')} dv'$$

where $P_{diss}(E(t,d), d, \sigma, \rho, T, V))$ is the power dissipated in a cube of volume V centered at a point d; m is the mass of tissue inside the cube, $\sigma(d)$ is tissue conductivity, $\rho(d)$ is the tissue mass density, and $E(t,d)$ is the three-dimensional vector of the electric field phasor at location d and time t, and its Hermitian transpose is represented by $E^H(t,d)$. SAR is averaged over a time period of T usually chosen to adequately represent variations in the source signal that are customary for the type of device and modulation in typical use, but in the examples discussed herein is limited to a maximum of 30 minutes for general public exposure.

One of ordinary skill will understand that SAR is measured as a "spatial average" over a volume. In the USA, the Federal Communications Commission (FCC) specifies that V should correspond to one gram cube of tissue (so-called 1 g SAR) as discussed below. Since human tissue density is approximately the same as water, this can be estimated at 1 cm³. Many countries calculate SAR with a 10 g cube volume based on the mass of human eyeball.

For a multiple antenna transmitter with N antennas, the electric field $E(t,d)$ is a linear superposition of the N electric fields and can be written as $$E(t,d) = E(d)X(t), \qquad (2)$$

where $E(d) = [E_1(d)\ E_2(d)\ \ldots\ E_N(d)]$ is a 3×N complex valued matrix and each $E_i(d)$, i=1, ..., N is a 3×1 vector representing the three-dimensional electric field at a point d generated by an excitation for each of the N antenna individually. $X(t) = [x_1(t), x_2(t), \ldots, x_N(t)]^T$ represents baseband complex-valued input signals at the antenna ports 1, ..., N.

$$SAR = \frac{1}{|V(d)|} \int_{V(d)} \frac{\sigma(d')\frac{1}{T}\int X^H(t)E^H(d')E(d')X(t)dt}{2\rho(d')} dv' = \qquad (3)$$

$$\frac{1}{|V(d)|} \int_{V(d)} \frac{\sigma(d')tr\{E^H(d')E(d')\frac{1}{T}\int X(t)X^H(t)dt\}}{2\rho(d')} dv' =$$

$$\frac{1}{|V(d)|} \int_{V(d)} \frac{\sigma(d')tr\{E^H(d')E(d')R_x\}}{2\rho(d')} dv',$$

where tr{.} denotes the trace of a matrix, and one of ordinary skill will recognize the fact that $b^H A b = tr\{b^H A b\} = tr\{A b b^H\}$ for any vector and matrix with compatible dimensions. The time average covariance of $X(t)$, $R_x$, is defined as an N×N matrix:

$$R_x = \frac{1}{T} \int X(t)X^H(t)dt. \qquad (4)$$

The local SAR matrix, $R_d$, is defined as $$R_d = \frac{\sigma(d)}{2\rho(d)} E^H(d) \cdot E(d), \qquad (5)$$

where d is the location of measurement, for example the location of a probe measuring the electric field. Volume averaging this yields:

$$SAR = \frac{1}{|V(d)|} \int_{V(d)} tr\{R_{d'} R_x\} dv'. \qquad (6)$$

The influence of the transmitted signal $X(t)$ on SAR is solely through the covariance $R_x$ as averaged over the measurement interval T. In particular, two different $X(t)$ have the same SAR if they have the same $R_x$. The volume average SAR, $R_{V(d)}$, matrix can then be defined as $$R_{V(d)} = \frac{1}{|V(d)|} \int_{V(d)} R_{d'} dv'. \qquad (7)$$

The volume integral can be brought inside utilizing the trace of equation (6):

$$SAR = SAR(R_{V(d)}, R_x) = tr\{R_{V(d)} R_x\}. \qquad (8)$$

A non-volume averaged, local SAR can further be defined as $$SAR_L = SAR(R_d, R_x) = tr\{R_d R_x\}. \qquad (9)$$

The peak spatial average SAR for a given excitation signal can be defined as $$SAR^* = SAR^*(R_x) = \max_d SAR(R_{V(d)}, R_x). \quad (10)$$

To determine compliance, $SAR^*(R_x)$ shown in equation (10) is compared to a prescribed SAR threshold:

$$SAR^*(R_x) \leq SAR_0 \,\forall X(t) \quad (11)$$

where $SAR_0=1.6$ W/kg in the US. $SAR^*(R_x)$ is typically evaluated for a variety of typical holding or wearing positions or "gestures" of the device near the face and body, and $R_{V(d)}$ is a function of the gesture.

A brute force measurement of $SAR^*(R_x)$ for any excitation requires measurement time per probe location equal to the number of possible distinct excitations. The methods of the present disclosure established that using measurement time per probe location that is at most linear, no matter how many distinct possible transmitted signals there are.

Generally, volume-average SAR, as shown in equation (8), is computed by measuring local SAR, see equation (9), and integrating or averaging numerically over a volume. Therefore, local SAR measurements, denoted by $\widetilde{SAR}_L$ (d, $R_x$), using a probe or array of sensors, form the heart of any SAR compliance process. As shown by equations (7) and (8), knowledge of the local SAR matrix, $R_d$, is needed to evaluate the SAR for any excitation $X(t)$. To determine compliance of a device, the SAR for all $X(t)$ must either be the measured $\widetilde{SAR}$ (d, $R_x$), or evaluated in the form shown equation (8) for all $X(t)$. Unless the number of distinct possible transmitted signals is smaller than the number of measurements needed to estimate $R_d$, it is advantageous to use equation (8) to determine compliance. Further using an estimation of $R_d$ requires only computer time, as opposed to measurement and laboratory time.

Some properties of $R_d$ can be exploited to simplify estimation of $R_d$. For example, $R_d$ derives from the local electric field $E(d)$, which is 3×N complex matrix. Hence, the $R_d$ obeys $\text{rank}(R_d) \leq 3$. The process of estimating $R_d$ therefore first involves determining the number of degrees of freedom it contains. Any N×N positive semi-definite Hermitian matrix with rank three, like $R_d$, can be parameterized by 6N-9 independent parameters. Therefore, 6N-9 is a lower boundary for the number of measurements needed to estimate local SAR matrix. Generally, the elements of $R_d$ cannot be directly measured. $\widetilde{SAR}_L$ (d, $e_i e_i^T$) where $e_i$ is an N×1 vector that has one in the ith entry and zeros otherwise yields $r_{d_{ii}}$ the diagonal entry of $R_d$. But the off-diagonal entries of $R_d$ cannot be directly measured by a single choice of excitation.

As a final preliminary matter, a few defined features of the signals, $X(t)$, are examined. If uncorrelated or non-coherent signals are transmitted, as when the averaging time is long compared with the variation of the relative phases and amplitudes of the entries of $X(t)$, then $R_x = \text{diag}(r_{x_{11}}, r_{x_{22}}, \ldots, r_{x_{NN}})$, where $\text{diag}(.)$ represent a diagonal matrix. At the other extreme, if $X(t)$ maintains a fixed amplitude and phase relationship among its entries for the time-averaging duration, such that $$X(t) = x_{\theta,p} \cdot u(t), \quad (12)$$

Where $u(t)$ represents the modulated data signal with unit power ($\langle |u(t)|^2 \rangle_T = 1$), and $x_{\theta,p} = [\sqrt{p_1} e^{j\theta_2}, \ldots, \sqrt{p_N} e^{j\theta_N}]^T$, where $p = [\sqrt{p_1}, \sqrt{p_1}, \sqrt{p_2}, \ldots, \sqrt{p_N}]^T$ and $\theta = [\theta_1, \theta_2, \ldots, \theta_N]^T$ represent the powers and phases at the antennas. Then $R_x = x_{\theta,p} x_{\theta,p}^H$ is rank-one.

Figure 2A:
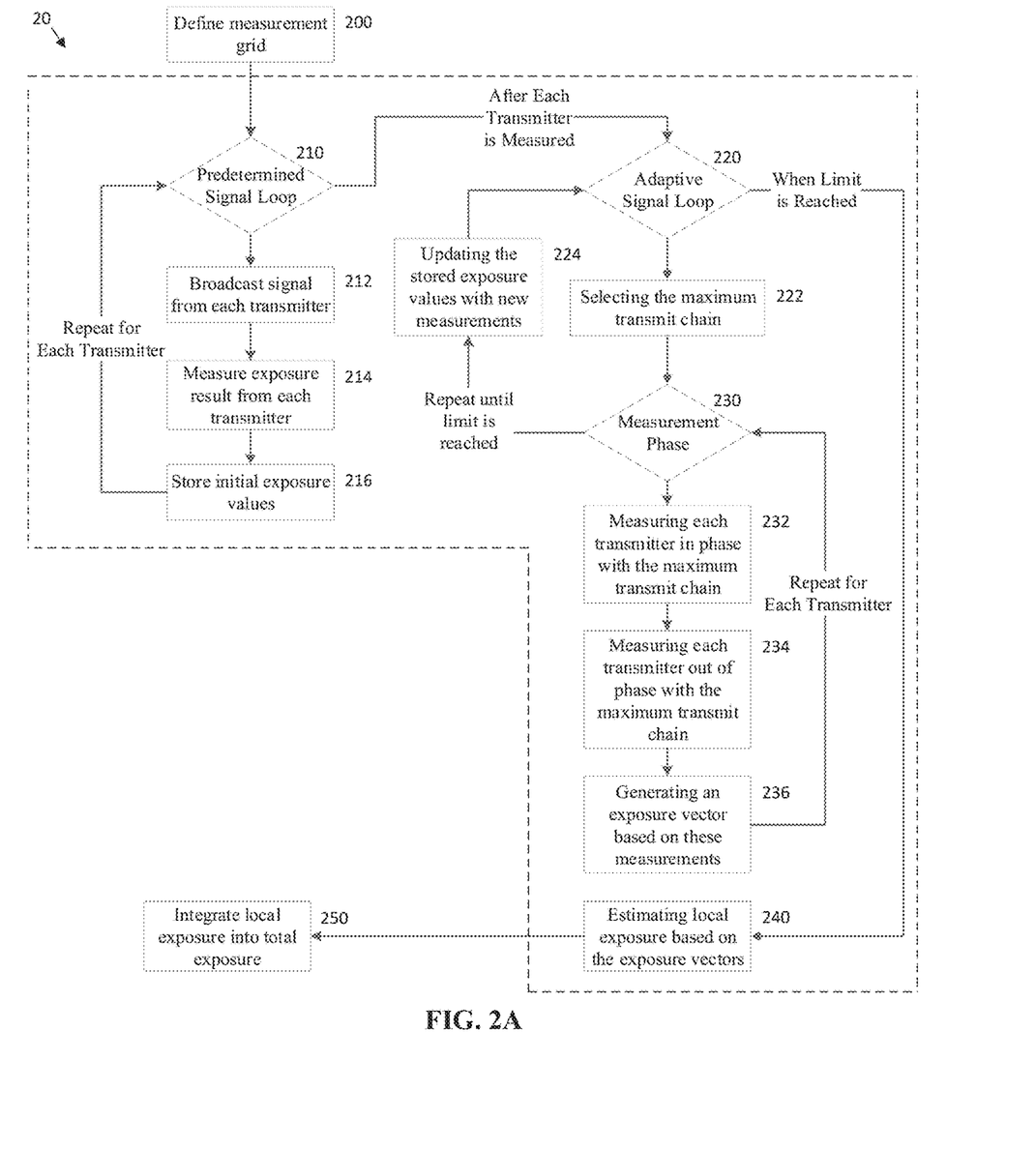
FIG. 2A is a flow chart of a first method of determining compliance of electromagnetic exposure standards according to the teachings of the present disclosure.

Referring now to FIG. 2A, the flowchart 20 shows another example method of determining compliance of electromagnetic exposure standards according to the teachings of the present disclosure. To initiate the compliance evaluation method, a set of measurement points is defined at block 200. In the example shown, the set of measurement points is a regular rectangular grid. The remaining steps, except for the final integration of previous data, are repeated for each of the measurement points.

For each measurement point, the first excitations are determined in advance but the remaining excitations are adaptive in that they are determined in response to previous measurements. At a high-level view, this makes up the two-stage analysis shown in the flowchart 20. The first stage (blocks 210-216) is to measure electromagnetic exposure values from transmitting a set of excitation signals, such signals chosen in advance of any measurement. The second stage (blocks 220-236) finds a set of excitation signals, such signals adaptively chosen based on the result of previous measurements, and measures the electromagnetic exposure values of those signals.

At block 210, the predetermined signals are looped through to develop a baseline of the radiative exposure generated by each signal transmitter separately. In this example, the initial predetermined signal loop is a loop turning each of the antennas on, one at a time transmitting a constant value while the remaining antennas are off. To do so, each transmitter broadcasts a predetermined signal at block 212. In this example, the tested device can be controlled to individually set signal content and quality. In the example method, these signals are all initiated at maximum power as this should create the highest SAR results. At block 214, each resulting radiative exposure result is measured by the measurement device. At block 216, initial exposure values are stored by a controller in data storage. These steps 212 to 216 are repeated for each transmitter on the tested device, so that a baseline of exposure values for each signal is understood.

At block 230, the adaptive measurement phase begins to efficiently find a maximum exposure signal. The adaptive loop uses the baseline data to drive the method toward a maximum exposure signal faster. At block 222, the previous signal or combination of signals with the highest exposure result is selected in order to pivot around this data point for more efficient results. In the initial adaptive loop of the example shown, this is the single signal with the highest radiative exposure measurement. In the later adaptive loops in this example, these are combinations of signals that have produced high signals.

In this example, the adaptive measurements are performed in two parts. At block 232, each transmitter is measured in phase with the maximum transmit chain. Following this, at block 234, each transmitter is measured out of phase with the maximum transmit chain. This is repeated for each transmitter. The signals are constant during the measurement interval, and that turn the antennas on individually and in pairs. The device must therefore have the ability to transmit such predetermined signals during testing, even if it does not use such signals during normal operation. As one of ordinary skill in the art would appreciate, the basic methods of the algorithm are not constrained to only these types of signals and could be used with other combinations of signals. These adaptive measurement steps are repeated for each transmitter or antenna on the tested device. At block 236, an exposure vector is generated based on these measurements and at block 224, the stored exposure values updated with new measurements. The exposure vector therefore is the combination of signals with the highest exposure pattern. These adaptive measurement steps are repeated several times on the tested device until the limit is reached. In the example shown, the adaptive loop is repeated three times. As discussed in more detail below, this is necessary and sufficient to satisfy compliance requirements.

When the limit for the adaptive signal loop is reached, the local exposure is estimated at block 240. In the example shown, the generated exposure vectors are used to estimate the local exposure for any signal from the antennas of the tested device. The two-stage measurement is repeated for each measurement point, and the local exposure data is combined into the total exposure information at block 250. This step may also include a compliance checking step to make sure the tested device satisfies the governmental standards at issue.

A specific implementation of the method shown in FIG. 2A is described in Algorithm 1 below and shown in FIG. 2B. The shaded areas of the algorithm represent where the SAR measurement are made. The input for this algorithm 1 is the location of the SAR measurement d, one of the grid points, where all of the measurements are being made for this round, and its output is the local estimated exposure matrix $\hat{R}_d$. Numbering has been included in the right-hand side of the algorithm description and is used here for reference.

In algorithm 1, the corresponding electromagnetic exposure measure (SAR) is stored as $c_i$. The vector $c=[c_1, c_2, \ldots, c_N]$ stores all of the SAR values. These SAR measurements are in response to "signals or excitations chosen in advance of any measurement". The example algorithm sets k=0, and $f_1=f_2=f_3=[0,0,\ldots,0]$. As shown in FIG. 2B, a copy of vector c is stored in vector q (Assume q is a non-zero vector) for later processing.

After each transmitter is measured in the algorithm's initial loop using the predetermined signals, an adaptive signal loop is initiated. In algorithm 1, k is a loop variable that takes on the values 0, 1, 2 through the loop. At the beginning of the adaptive loop, the algorithm selects a transmit chain that has produced the maximum exposure value and called $l_k$. In the first iteration of the loop, the transmit chain with the maximum value of SAR is found. In algorithm 1, the SAR of transmit chain $l_k$, which is also $q_{l_k}$, is stored in $f_{l_k k}$. In the algorithm, the step (3) is repeated with k incremented.

Figure 2B:
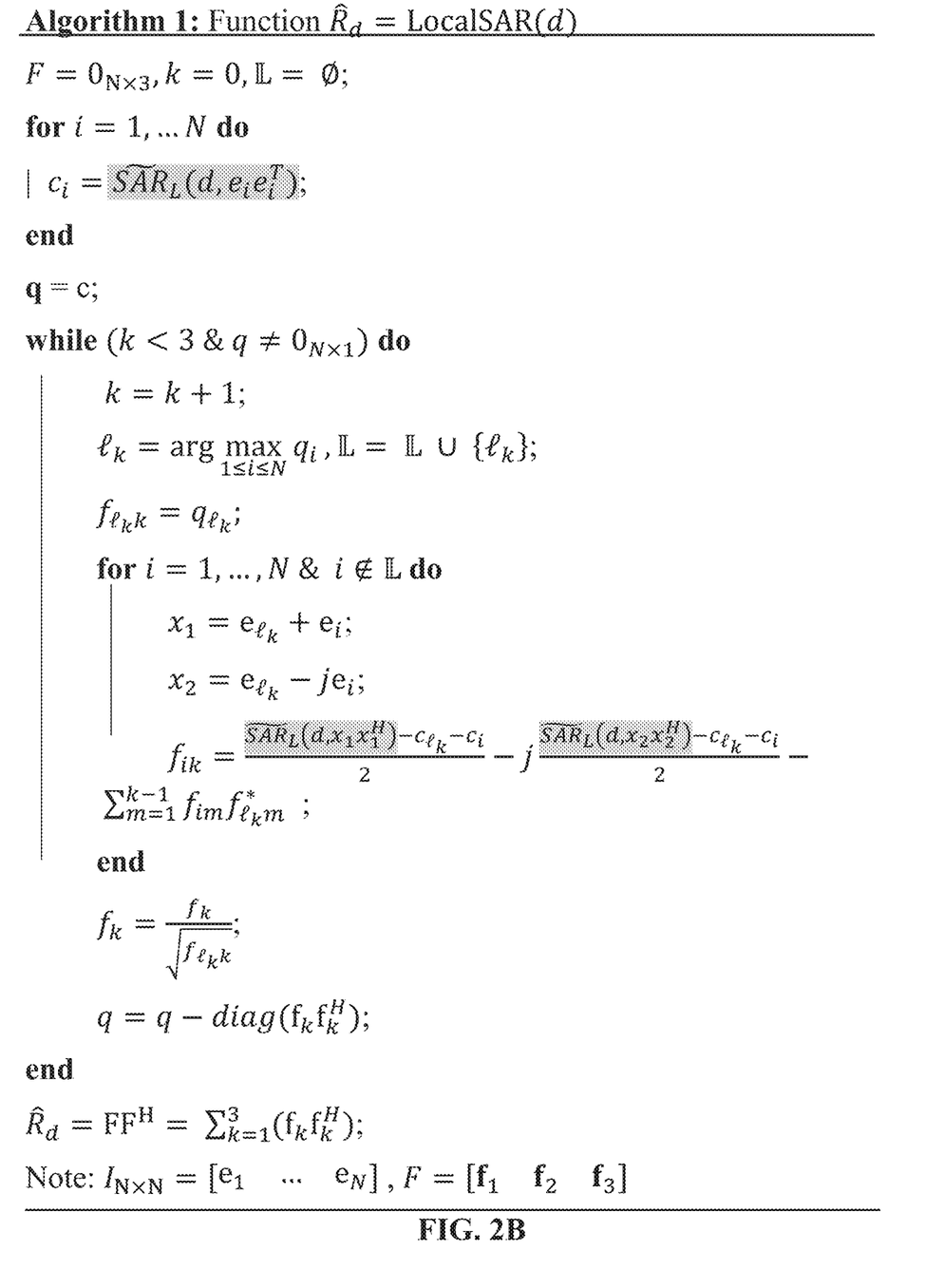
FIG. 2B is a depiction of an example algorithm implementing the methods of the present disclosure.

A series of SAR measurements is now performed, shown highlighted in FIG. 2B, where the transmit chain $l_k$ is turned on simultaneously along with the remaining other chains i=1, ..., N, one at a time (therefore only transmitter pairs $l_k$ and i are turned on at once). Two measurements are made for each pair, one with the transmitters in phase with each other, the other with the transmitters shifted by −90 degrees. These measurements are then manipulated in a mathematical expression as shown in the algorithm to create $f_{ik}$ and filling the vector $f_k=[f_{1k}, f_{2k}, \ldots, f_{Nk}]$. These SAR measurements are "adaptive" as they include the previous measurements obtained in step (1).

Finally, the vector $f_k$ is used to update the vector $q=[q_1, q_2, \ldots, q_N]$, thereby updating the exposure vectors that provide the algorithm with the information about the resulting exposure data from each of the tested transmit chains. In algorithm 1, the vector $f_k$ is normalized. Once k=3, the vectors $f_1$, $f_2$, $f_3$ are used to calculate the local SAR matrix $\hat{R}_d$, which is the output of the algorithm. Proof that this algorithm determines $R_d$ with 7N-12 local SAR measurements is included at the end of this disclosure.

Once the covariance of SAR has been determined the local SAR can be estimated for any signal. Using equations (4) and (9):

$$\widehat{SAR}_L = SAR(\hat{R}_d, R_x) = tr\{\hat{R}_d R_x\} \tag{13}$$

To evaluate volume-average SAR, $R_{V(d)}$ is computed in equation (7) numerically. Such averaging is commonly done to convert local SAR measurements to a volume-average measurement. Let $G'(d) = G \cap V(d)$ be the grid points in either the 1 g or 10 g volume V centered at d. Then the approximation of equation (7) is $$R_{V(d)} \cong \frac{1}{|G'(d)|} \sum_{d' \in G'(d)} R_{d'} \tag{14}$$

For a regular lattice grid, $$\hat{R}_{V(d)} = \frac{\sum_{i=-n}^{n} \sum_{j=-m}^{m} \sum_{k=-l}^{l} R_{d+[i\Delta x, j\Delta y, k\Delta z]}}{(2n+1)(2m+1)(2l+1)} \tag{15}$$

where the spacing along the axes are $\Delta x$, $\Delta y$ and $\Delta z$, and the number of averaging points inside V(d) are 2n+1, 2m+1 and 2l+1 along x, y and z. In general, the examples shown herein are $\Delta x = \Delta y = \Delta z \approx 1$ mm. The volume-average SAR estimate is then:

$$\widehat{SAR} = SAR(\hat{R}_{V(d)}, R_x) = tr\{\hat{R}_{V(d)} R_x\} \tag{16}$$

The peak spatial average SAR estimate $$\widehat{SAR}^s(R_x) = \max_d SAR(\hat{R}_{V(d)}, R_x) \tag{17}$$

Similarly, the measured peak spatial average SAR $$\widehat{SAR}^s(R_x) = \max_d \widehat{SAR}(d, R_x) \tag{18}$$

An upper bound for PSA SAR shown in equation (10) of beamforming transmitters is presented in equation (19) that requires a number of measurements per probe location equal to the number of antennas. Since the bound is easy to compute, it is an easy compliance check on a device—if the bound is less than the SAR limit, then the device is compliant. The bound is:

$$\widehat{SAR}^s(x_{\theta,p}) \leq \max_d \left( \sum_{n=1}^{N} \sqrt{\widehat{SAR}(d, e_n e_n^T)} \right)^2 \tag{19}$$

In some examples of the method, a compliance check occurs after block 340. Device compliance check using equation (17) for other excitations are possible without additional measurements.

Figure 2C:
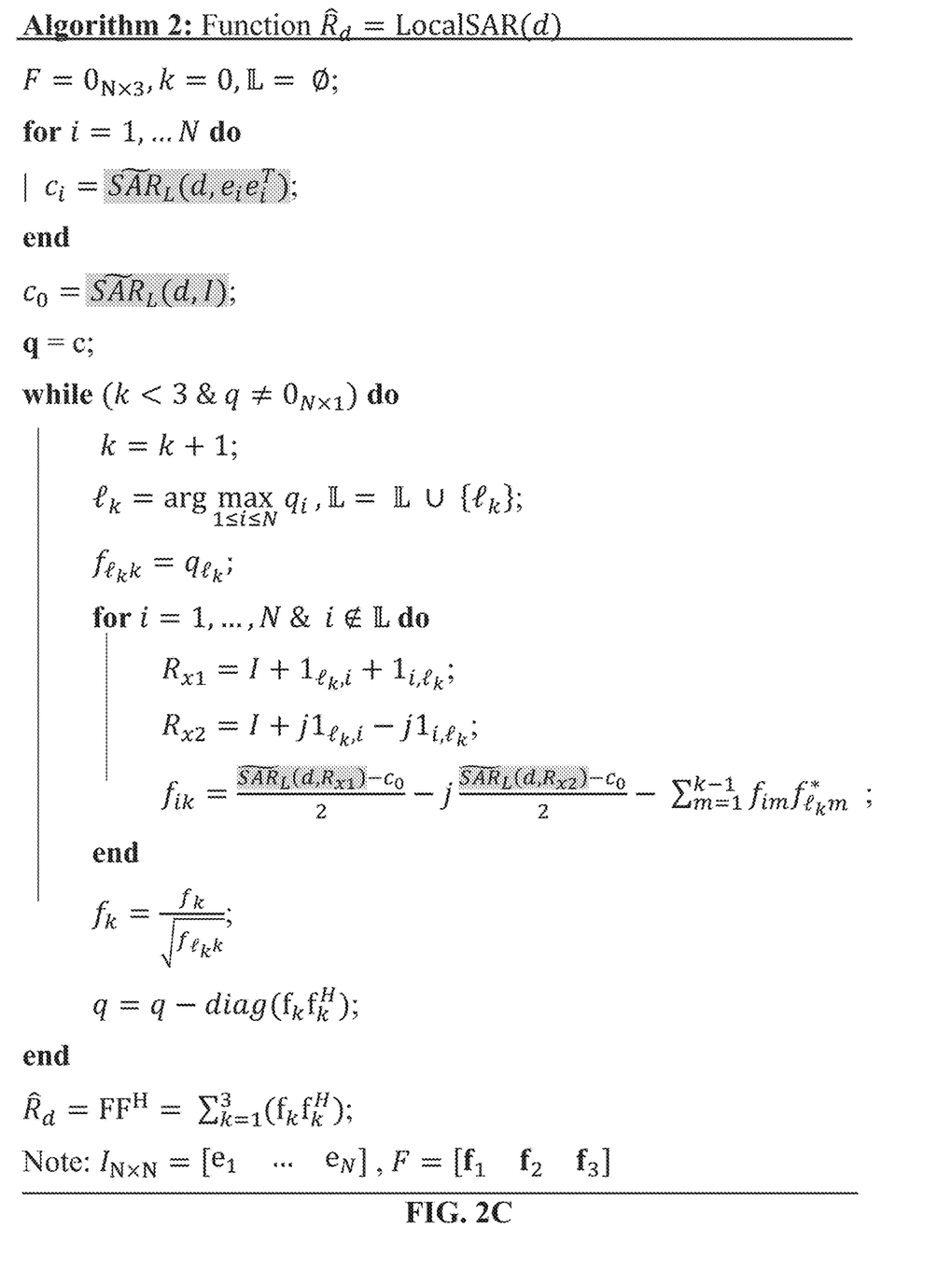
FIG. 2C is a depiction of another example algorithm implementing the methods of the present disclosure.

Other variants of the method shown in the flowchart 20, include algorithm 2 shown at FIG. 2C. Algorithm 2 is used for example when the device being tested for SAR compliance cannot generate the signals required in Algorithm 1, specifically such that it cannot turn on two antennas at once, or the device is restricted to transmitting signals only from a predefined beamformer or codebook.

The excitations with two antennas used in the first example, algorithm 1, can instead be replaced by time-varying excitations, for which $R_x$, with rank greater than one are possible. Useful signals include those for which $R_x$ is proportional to the identity matrix, such as $$X(t) = \sum_{i=1}^{N} e_i \cdot 1\left\{\frac{(i-1)T}{N} \leq t < \frac{iT}{N}\right\} \quad (20)$$

where $1\{.\}$ indicates unity when the condition inside the braces is met, and zero otherwise. This signal turns the antennas on one at a time, and obtains $$R_x = \frac{1}{N}I.$$

A signal that has all of the antennas on at the same time is $$X(t) = e_1 + \Sigma_{k=0}^{2^{N-1}-1} \Sigma_{i=2}^{N} (-e_i)^{\left\lfloor \frac{k}{2^{i-1}} \right\rfloor} \cdot 1\left\{\frac{kT}{2^{N-1}} \leq t < \frac{(k+1)T}{2^{N-1}}\right\} \quad (21)$$

This signal keeps the first antenna at zero phase while alternating the phases of the remaining antennas between 0 and π. This process ensures that the signals appear "uncorrelated" across the antennas, and thus obtains $R_x=1$. This has the benefit of yielding an N-fold higher SAR value than equation (20), and hence a correspondingly higher signal to noise ratio (SNR). Even though this appears more complicated than equation (20), a transmitter's beamforming signal set or codebook often contains signals where phases of 0 and π are possible, with all of the antennas turned on.

More generally, let signals be chosen from a codebook such that the following covariances are possible:

$R_{x_0} = \Lambda$ $R_{x_1} = \Lambda + 1_{l,i} + 1_{i,l}$ $R_{x_2} = \Lambda + j1_{l,i} - j1_{i,l} \quad (22)$ for some positive semi-definite N×N matrix $\Lambda$, where $1_{i,i}$ denotes a matrix that is zero everywhere except it has a one in the (i,i) element. For example, by modifying equation (21) to hold the phase of the lth and ith antennas constant while the remaining antennas/transmitters are alternated between 0 and π, equation (22) is obtained with $\Lambda=1$. Therefore, algorithm 2 is a modified version of algorithm 1.

Figure 3:
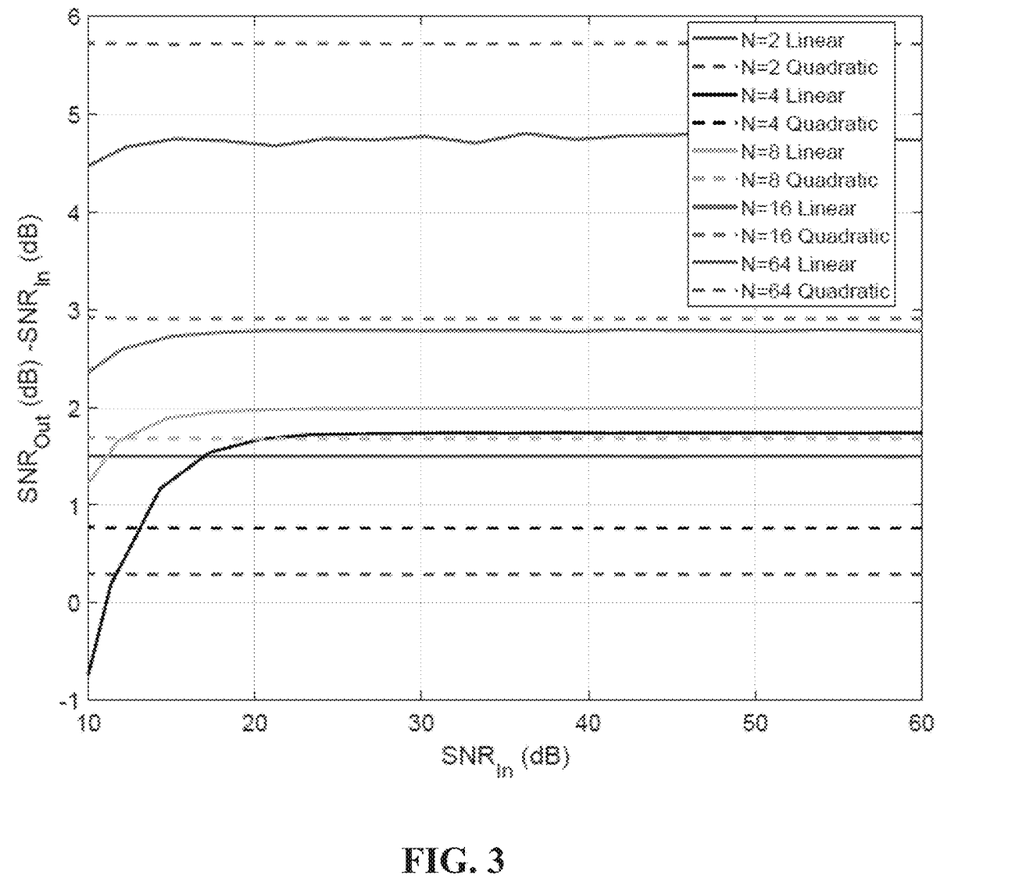
FIG. 3 depicts the gain vs signal of exposure measurements showing the performance of the methods according to the teachings of the present disclosure.

The performance of the methods of the present teachings can be evaluated by an analysis of the signal in the presence of additive measurement noise. FIG. 3 depicts the gain vs signal to noise of the input showing the performance of the methods according to the teachings of the present disclosure. Varying the Signal to Noise Ratio in is achieved by changing $\sigma^2$, and the performance for several N is shown. Performance of the methods are also compared to a conventional quadratic algorithm as well, as disclosed in, for example, "Measurement procedure to determine SAR of multiple antenna transmitters using scalar electric field probes," by Le et. al in 2014 *International Conference Technologies for Communications*, (October 2014, pp. 54-59).

Figure 4A:
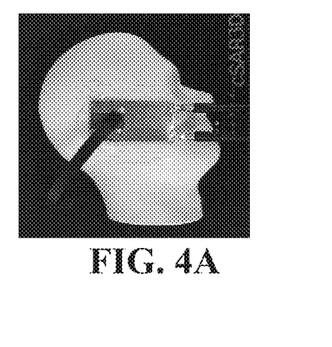
FIG. 4A shows an example test device placed next to an example head phantom.
Figure 4B:
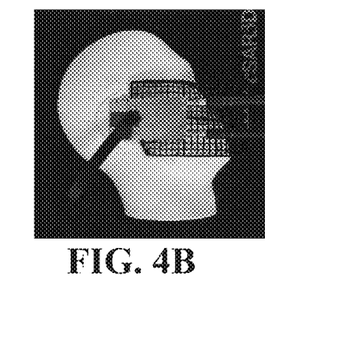
FIG. 4B shows a second example test device placed next to an example head phantom.
Figure 5A:
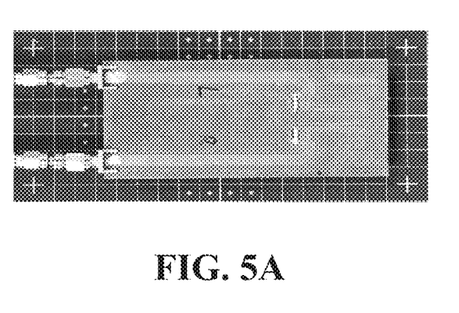
FIG. 5A is a photograph of an example two antenna device tested according to the teachings of the present disclosure.
Figure 5B:
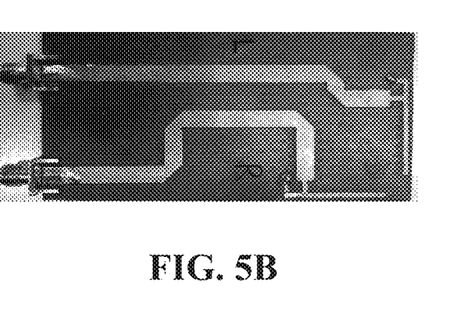
FIG. 5B is a photograph of an example two antenna orthogonal IFA device tested according to the teachings of the present disclosure.
Figure 5C:
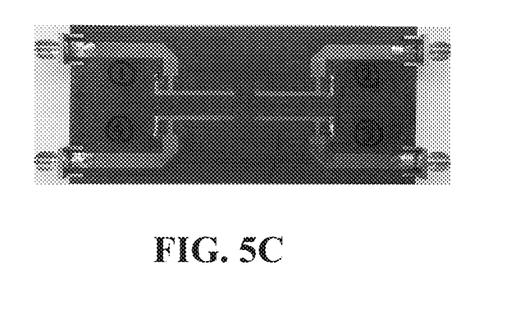
FIG. 5C is a photograph of an example four antenna IFA device tested according to the teachings of the present disclosure.
Figure 5D:
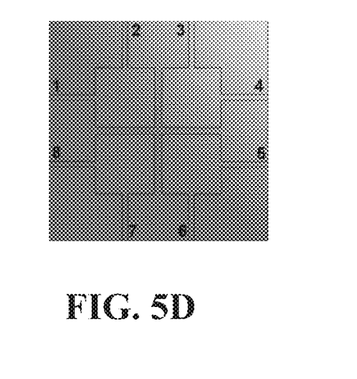
FIG. 5D is a photograph of an example four dual-feed patch antennas tested according to the teachings of the present disclosure.

For the following figures, some simple antenna and gesture arrangements are used to validate the methods and evaluating the performance of the algorithm versus brute force measurement of SAR. FIG. 4A shows an example test device placed next to an example head phantom in a first touch gesture. FIG. 4B shows a second 15 degree tilt gesture of the test device position next to the head phantom. The devices to be tested are shown in FIG. 5A-5D. FIG. 5A shows a parallel IFA configuration and FIG. 5B shows an orthogonal IFA device. Likewise, FIG. 5C is a photograph of an example four antenna IFA device and FIG. 5D shows a four dual-feed patch antennas device.

The device shown in FIG. 5A has two inverted-F 2.45 GHz antennas (IFAs) which are parallel, modeling them after antennas for typical mobile devices. The coupling between the antennas is generally large ($S_{12}=-4.1$ dB) because of their proximity to each other. Table 1 shows the results of the comparing the methods of estimating SAR and a brute force measurement. The table shows both average error of the individual local SAR estimates of this method and the measurements as well as absolute error between the maximum SAR estimates of this method and the measurement. The boundary error is the absolute error between the measured values and the compliance limit.

TABLE 1

| Antenna Gesture\Error | Parallel | | | Orthogonal | | |
|---|---|---|---|---|---|---|
| (W/kg) | Average | Absolute | Boundary | Average | Absolute | Boundary |
| Back-side | 0.028 | 0.0069 | 2.82 | 0.022 | 0.048 | 1.74 |
| Back-side 15-tilt | 0.035 | 0.013 | 0.97 | 0.020 | 0.034 | 2.39 |
| Back-side Touch | 0.031 | 0.045 | 2.03 | 0.016 | 0.031 | 1.32 |
| Front-side | 0.042 | 0.018 | 4.70 | 0.025 | 0.0014 | 1.76 |
| Front-side 15-tilt | 0.018 | 0.022 | 2.42 | 0.025 | 0.0016 | 0.93 |
| Front-side Touch | 0.048 | 0.018 | 3.17 | 0.020 | 0.0052 | 0.84 |
| Left-side | 0.020 | 0.021 | 0.01 | 0.0055 | 0.0026 | 0.01 |
| Right-side | 0.014 | 0.0044 | 0.03 | 0.018 | 0.010 | 0.01 |
| Top-side | 0.053 | 0.066 | 0.01 | 0.026 | 0.036 | 0.01 |

Figure 6A:
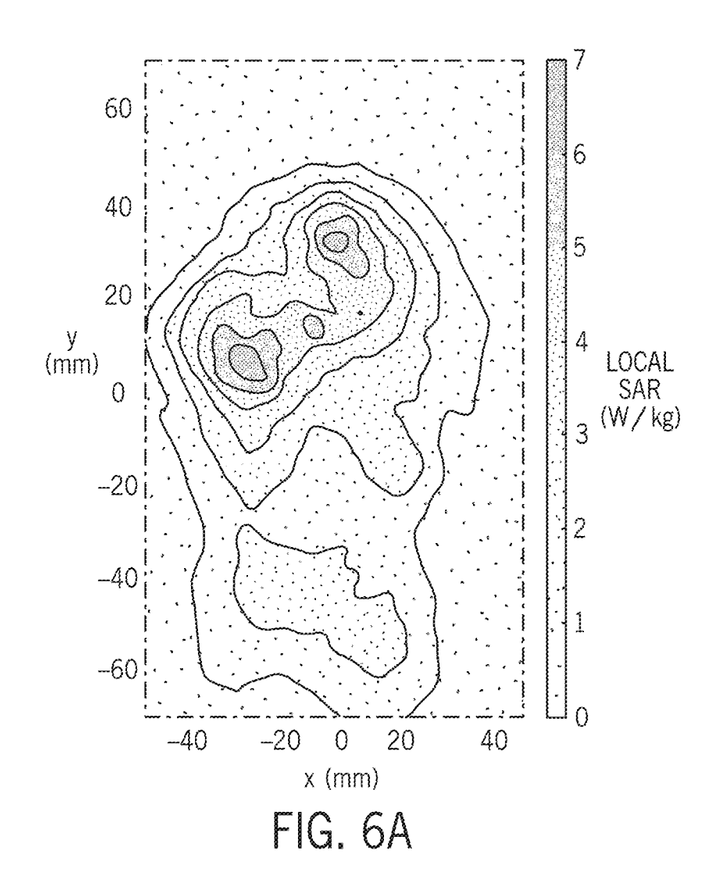
FIG. 6A is a diagram depicting actual SAR variations for an example two antenna device using the front-side gesture.
Figure 6B:
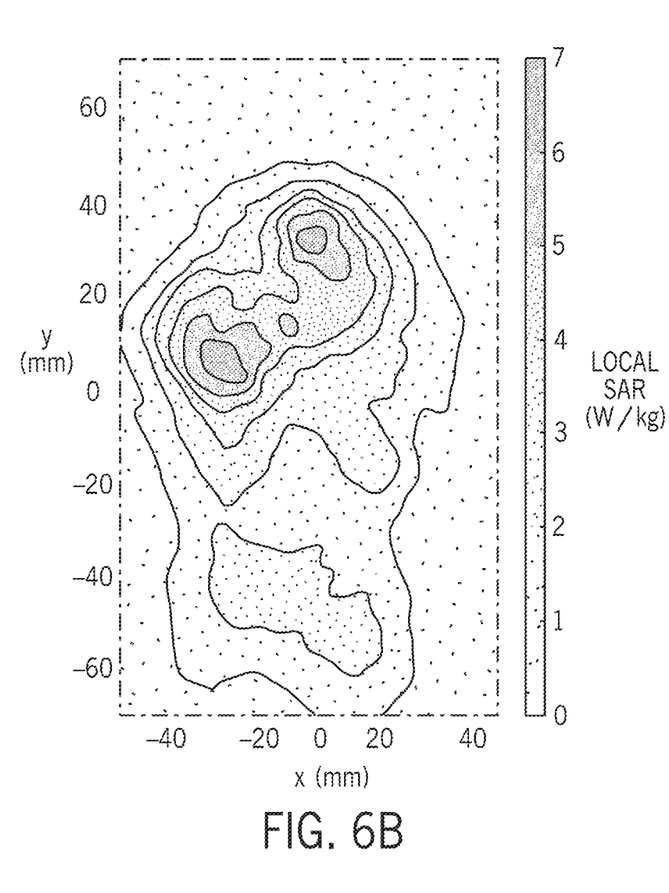
FIG. 6B is a diagram depicting estimated SAR variations for an example two antenna device using the front-side gesture using the teachings of the present disclosure.

Average and maximum error magnitude are, respectively 0.047 and 0.17 W/kg likely due to phase differences resulting from the testing equipment. The results for an example set of phases, $$x_{\theta,p} = \begin{bmatrix} 1 & e^{j\frac{8\pi}{9}} \end{bmatrix}^T$$

are also shown graphically in FIGS. 6A-6B. The FIGS. 6A-6B depict actual and estimated SAR variations for an example two antenna device using the front-side gesture.

Figure 7:
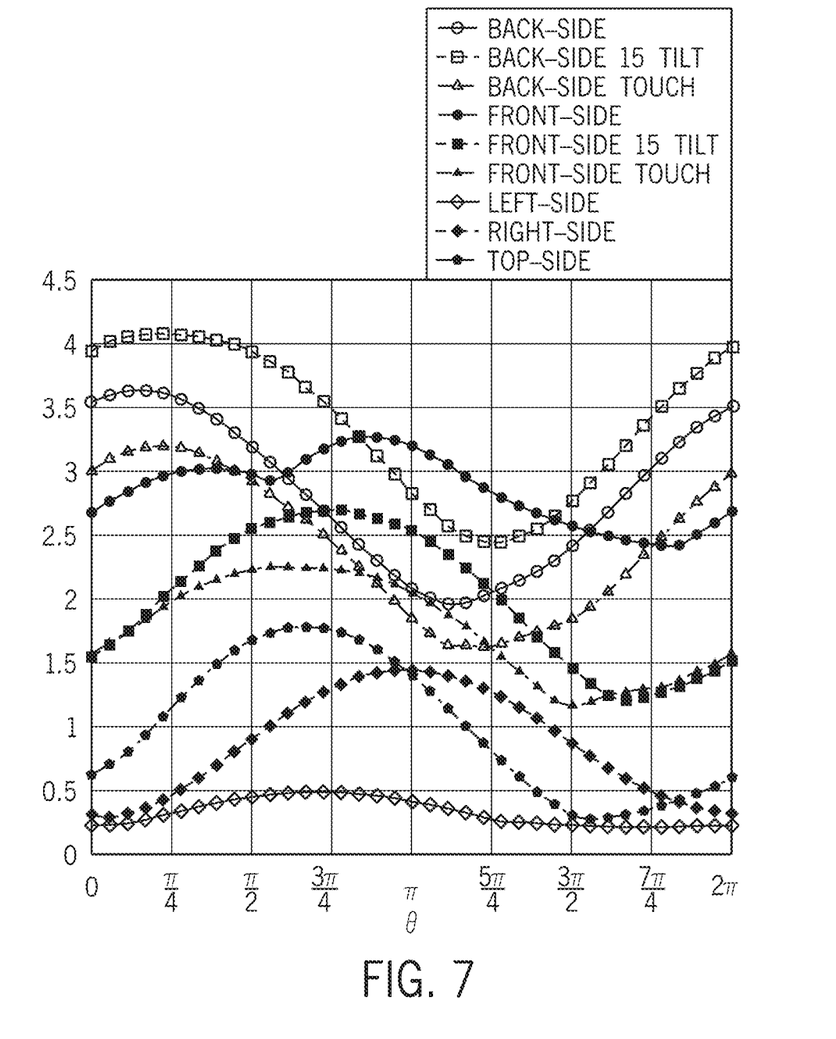
FIG. 7 is a graph showing measured (solid) and estimated (markers) SAR for orthogonal two antenna in various gesture configurations.

FIG. 7 is a graph showing measured (solid) and estimated (markers) SAR for orthogonal two antenna in various phases, $x_{\theta,p}=[1 \ e^{j\theta_2}]^T$. The process of creating a solid line estimated SAR requires 36 measurements (360 degrees in 10 degree increments) required only 4 measurements for the two antenna transmitter array.

The four-antenna device comprises four IFAs as shown in FIG. 5C, with resonance frequency 2.45 GHz, a transmit power 16 dBm of power and use a phase resolution of $\Delta\theta=45°$ $\theta$. The small average and absolute error show that very little accuracy is sacrificed by replacing the exhaustive 512 measurements by the 16 measurements used in the algorithm. Table 2 displays the results for the four antenna device.

TABLE 2

| Gesture\Error | Average | Absolute | Boundary |
|---|---|---|---|
| Back-side | 0.0178 | 0.0190 | 0.90 |
| Front-side | 0.0344 | 0.0273 | 1.09 |

For a device like that shown in FIG. 5C with four antennas, the number of measurements needed to find SAR using conventional methods would be 512. The methods disclosed above would be 7N−12=16 per probe location. For a device like that shown in FIG. 5D with eight antennas, the number of measurements needed to find SAR using conventional methods would be U.S. Pat. No. 2,097,152. The methods disclosed above would be 7N−12=44 per probe location. The results are tabulated in Table III for the eight antenna, and show excellent agreement between estimated and simulated Peak Spatial Average SAR.

TABLE 3

| Gesture\Error | Absolute | Boundary |
|---|---|---|
| Front-side | 0.0118 | 9.35 |
| Front-side 15-tilt | 0.0178 | 12.15 |
| Front-side Touch | 0.0135 | 5.21 |

Proof that this algorithm determines $R_d$ with 7N−12 local SAR measurements is included at the end of this disclosure. for N≥3 in the absence of noise relies on the assumptions that $R_d$ is a positive semi-definite complex Hermitian matrix with rank three and that the rank of $R_{x_j}$ is one.

The number of measurements is sufficient because Algorithm 1 essentially computes a modified Cholesky decomposition of the rank-three matrix $R_d$. The algorithm first evaluates all diagonal elements of $R_d$ by the excitations $x_i=e_i$ for i=1, ..., N, yielding $r_{d_{ii}}=\widetilde{SAR}_L(d, e_i e_i^T)$. Then the largest diagonal element of $R_d$ is found; assume it is $r_{d_{11}}(l_i=1)$. To find the first row and ith column entry $r_{d_{1i}}$ of $R_d$, the following excitations are used:

$$x_{N+2i-3}=e_1+e_i, i=2,\ldots,N,$$

$$x_{N+2i-2}=e_1-je_i, i=2,\ldots,N. \quad (23)$$

Yielding the local SAR measurements $$\widetilde{SAR}_L(d, x_{N+2i-1}x_{N+2i-1}^H)=r_{d_{11}}+r_{d_{ii}}+2Re\{r_{d_{1i}}\},$$

$$\widetilde{SAR}_L(d, x_{N+2i}x_{N+2i}^H)=r_{d_{11}}+r_{d_{ii}}2Im\{r_{d_{1i}}\}. \quad (24)$$

Since there are estimates of $r_{d_{11}}$ and $r_{d_{ii}}$, $r_{d_{1i}}$ can be solved for. Therefore, 2(N−1) SAR measurements are needed to find $r_{d_{1i}}$ for i=2, ..., N. The column $f_1$ is built $f_1=1/\sqrt{r_{d_{11}}}$ $[r_{d_{11}}, \ldots, r_{d_{1N}}]^T$, and $f_1 f_1^H$ represents a rank one estimate of $R_d$.

The form $q=\text{diag}(r_{d_{11}}, \ldots, r_{NN})-\text{diag}(f_1 f_1^H)$, where the first element of q is zero, and its remaining elements are nonnegative. The largest element of q is found and repeat the above process to $l_2$ and $l_3$. Since $R_d$ is Hermitian $$\left(r_{d_{l_k k}}=r^*_{d_{l_k k}}\right)$$

each step needs two fewer measurements in the form of equation (24). Therefore, N+2(N−1)+2(N−2)+2(N−3)=7N−12. Finally, $R_d=\Sigma_{k=1}^3 f_k f_k^H$.

The number of measurements is shown to be necessary by parsing $R_d$ into a rank-one matrix and a rank-two matrix. The Cholesky decomposition can be used to denote $R_d=FF^H=\Sigma_{k=1}^3 f_k f_k^H$, where $$F^H = \begin{bmatrix} f_{11}^* & f_{21}^* & f_{31}^* & f_{41}^* & \cdots & f_{N1}^* \\ 0 & f_{22}^* & f_{32}^* & f_{42}^* & \cdots & f_{N2}^* \\ 0 & 0 & f_{33}^* & f_{43}^* & \cdots & f_{N3}^* \end{bmatrix} \quad (25)$$

Such that $\widetilde{SAR}_L(d, R_{x_j})=\text{tr}\{R_d, R_{x_j}\}=x_i^H R_d x_i = \Sigma_{k=1}^3 x_i^H f_k f_k^H x_i$. By considering the modified SAR measurement $\widetilde{SAR}_L(d, R_{x_j})-\Sigma_{k=1}^2 x_i^H f_k f_k^H x_i=x_i^H f_3 f_3^H x_i$. The matrix $f_3 f_3^H$ is N×N and rank-one, but $f_3$ has only N−2 non-zero elements. Using the fact that for a rank-one matrix, $f_3 f_3^H$, the estimation of $R_d$ requires 3(N−2)−2 local SAR measurements, denoted by $M_1 \geq 3(N-2)-2$. To bound the number of local SAR measurements $M_2$ requires to find $\Sigma_{k-1}^2 f_k f_k^H$. This expression has 4N−4 unknowns, implying $M_2 \geq 4N-4$. Thus, $M=M_1+M_2$ must satisfy $M \geq 3(N-2)-2+4N-4=7N-12$.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents.

We claim:

1. A method of determining electromagnetic exposure values of a transmitting device having a plurality of transmit chains, comprising:
    transmitting one or more first excitation signals, the one or more first excitation signals chosen in advance of any measurement;
    measuring first electromagnetic exposure values from the transmitting of the one or more first excitation signals,
    transmitting one or more second excitation signals, wherein the one or more second excitation signals are adaptively chosen based on a result of previous measurements of the one or more first excitation signals,
    measuring second electromagnetic exposure values from the transmitting of the one or more second excitation signals, and
    inferring electromagnetic exposure values of all possible transmitted signals from a set of measured values comprising the first electromagnetic exposure values and the second electromagnetic exposure values.

2. The method of determining electromagnetic exposure values of claim 1, wherein a threshold for electromagnetic exposure is set, and the electromagnetic exposure values of all possible transmitted signals are compared with the threshold to determine compliance.

3. The method of determining electromagnetic exposure values of claim 2, wherein the compliance of the electromagnetic exposure values includes specific absorption rate (SAR).

4. The method of determining electromagnetic exposure values of claim 2, wherein the compliance of the electromagnetic exposure values includes maximum permissible exposure (MPE).

5. The method of determining electromagnetic exposure values of claim 1, wherein a total number of measurements has a linear relationship with a number of the transmit chains.

6. The method of determining electromagnetic exposure values of claim 1, wherein the excitation signals have two or fewer transmit chains active during the measurements.

7. The method of determining electromagnetic exposure values of claim 1, wherein post-processing is applied to the measurements to determine compliance.

8. The method of determining electromagnetic exposure values of claim 1, wherein a total number of excitation signals has a quadratic relationship with the number of transmit chains.

9. The method of determining electromagnetic exposure values of claim 1, wherein each electromagnetic exposure measurement corresponds to a non-time-varying excitation signal.

10. The method of determining electromagnetic exposure values of claim 1, wherein each electromagnetic exposure measurement corresponds to a time-varying excitation signal.

11. The method of determining electromagnetic exposure values of claim 1, wherein the transmitting device is used as a beamformer and excitation signals are specified by their phases and amplitudes on each transmitting device.

12. The method of determining electromagnetic exposure values of claim 1, wherein at least one excitation signal is taken from a codebook of possible transmitted signals.

13. A method of determining electromagnetic exposure values of a transmitting device having a plurality of transmit chains, comprising:
 transmitting a first set of excitation signals from transmit chains of the transmitting device;
 measuring a first set of electromagnetic exposure values resulting from the transmitting of the first set of excitation signals,
 storing the first set of electromagnetic exposure values;
 selecting a transmit chain with a maximum exposure value as the maximum transmit chain;
 adaptively transmitting a second set of excitation signals wherein the second set of excitation signals are a combination of the maximum transmit chain and another transmit chain;
 measuring a second set of electromagnetic exposure values from transmitting one or more second excitation signals;
 updating the stored first set of electromagnetic exposure values with the measured second set of electromagnetic exposure values;
 repeating the steps of adaptively selecting a maximum transmit chain, transmitting of at least two second excitation signals, and measurement for a predetermined number of times; and
 inferring local electromagnetic exposure values based upon the first and second set of electromagnetic exposure values.

14. The method of determining electromagnetic exposure values of claim 13 wherein the repeating happens at least three times.

15. The method of determining electromagnetic exposure values of claim 13 wherein generating the exposure vector based on all of the initial predetermined exposure values as well as the previous exposure vector.

16. The method of determining electromagnetic exposure values of claim 13 wherein the first and second excitation signals are taken from a codebook of possible transmitted signals.

17. The method of determining electromagnetic exposure values of claim 13 wherein the transmitting at least one second excitation signals adaptively further comprises:
 a first of the second excitation signal is a combination of the maximum transmit chain in phase with another transmit chain, and
 a second of the second excitation signal is a combination of the maximum transmit chain out of phase with another transmit chain.

18. An electromagnetic exposure testing apparatus, comprising:
 a transmitting device with multiple transmit chains;
 a measurement device configured to measure exposure values at a variety of measurement points; and
 a controller configured to send signals and capable of storing electromagnetic exposure values produces the measurement device;
 wherein the controller directs the transmitting device to send a first set of excitation signals from each transmit chain of the transmitting device and the measurement device measures a first set of electromagnetic exposure values produced in response to the first set of excitation signals, and the results are stored by the controller;
 wherein the controller directs the transmitting device to adaptively send a second set of excitation signals wherein the second set of excitation signals are a combination of the transmit chain that has produced the maximum exposure value in combination with another transmit chain;
 wherein the measurement device measures the second set of electromagnetic exposure values produced in response to the one or more second excitation signals, and the controller stores the second set of electromagnetic exposure values; and
 wherein the controller estimates local electromagnetic exposure values for each measurement point based on the first and second set of electromagnetic exposure values.

19. The electromagnetic exposure testing apparatus of claim 18 wherein the controller repeats the steps of adaptively selecting a maximum transmit chain, transmitting of at least two second excitation signals, and measurement of for a predetermined number of times.

20. The electromagnetic exposure testing apparatus of claim 18 wherein the measurement device is configured to move to each measurement point.

* * * * *